(12) United States Patent
Forman et al.

(10) Patent No.: US 10,001,539 B2
(45) Date of Patent: Jun. 19, 2018

(54) METHOD FOR DETERMINING A TYPE OF A RECONSTRUCTION OF IMAGE DATA FROM A MAGNETIC RESONANCE MEASUREMENT OF AN EXAMINATION OBJECT BY MEANS OF A MAGNETIC RESONANCE DEVICE

(71) Applicant: Siemens Aktiengesellschaft, München (DE)

(72) Inventors: Christoph Forman, Erlangen (DE); Jens Wetzl, Oberasbach (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 441 days.

(21) Appl. No.: 14/817,298

(22) Filed: Aug. 4, 2015

(65) Prior Publication Data

US 2016/0054419 A1    Feb. 25, 2016

(30) Foreign Application Priority Data

Aug. 22, 2014  (DE) ........................ 10 2014 216 751

(51) Int. Cl.
  *G01V 3/00*     (2006.01)
  *G01R 33/567*   (2006.01)
  *G01R 33/565*   (2006.01)

(52) U.S. Cl.
  CPC .... *G01R 33/5673* (2013.01); *G01R 33/56509* (2013.01)

(58) Field of Classification Search
  USPC ........................................ 324/309
  See application file for complete search history.

(56) References Cited

U.S. PATENT DOCUMENTS 9,626,777 B2*   4/2017  Forman ................ G06T 11/005
2005/0080328 A1*  4/2005  Vass ..................... A61B 5/0456
                                                600/407

(Continued)

FOREIGN PATENT DOCUMENTS

DE  102012206555 A1  10/2013
DE  102012213551 A1  2/2014

OTHER PUBLICATIONS

A.P. King, et al., "Thoracic respiratory motion estimation from MRI using a statistical model and a 2-D image navigator", Medical Image Analysis 16 (2012), pp. 252-264.

*Primary Examiner* — Rodney Fuller
(74) *Attorney, Agent, or Firm* — Harness, Dickey & Pierce, P.L.C.

(57) ABSTRACT

A method is for determining a type of reconstruction of image data from a magnetic resonance measurement of an examination object by way of a magnetic resonance device. In an embodiment, the method includes determining at least one first parameter which includes information about a breathing process of the examination object; comparing the at least one first parameter with at least one second parameter from a maintained database; and determining a type of reconstruction of image data of the magnetic resonance measurement according to the comparison that has been made. In an example embodiment, at least one of the at least one first parameter and the at least one second parameter is derived from a histogram of respiratory phases and the maintained database includes a self-learning system.

20 Claims, 2 Drawing Sheets

(56) References Cited

U.S. PATENT DOCUMENTS

| | | | |
|---|---|---|---|
| 2007/0118399 A1* | 5/2007 | Avinash | G06F 19/322 705/2 |
| 2013/0281827 A1 | 10/2013 | Stemmer | |
| 2014/0037169 A1 | 2/2014 | Fenchel | |
| 2014/0301622 A1* | 10/2014 | Forman | G06T 11/005 382/131 |
| 2015/0015691 A1* | 1/2015 | Forman | A61B 5/7292 348/77 |
| 2016/0169997 A1* | 6/2016 | Fautz | G01R 33/543 324/309 |

* cited by examiner

METHOD FOR DETERMINING A TYPE OF A RECONSTRUCTION OF IMAGE DATA FROM A MAGNETIC RESONANCE MEASUREMENT OF AN EXAMINATION OBJECT BY MEANS OF A MAGNETIC RESONANCE DEVICE

PRIORITY STATEMENT

The present application hereby claims priority under 35 U.S.C. § 119 to German patent application number DE 102014216751.5 filed Aug. 22, 2014, the entire contents of which are hereby incorporated herein by reference.

FIELD

At least one embodiment of the present invention generally relates to a method for the reconstruction of image data from a magnetic resonance measurement of an examination object by means of a magnetic resonance device, to a corresponding computer program product which allows a method of this kind to be carried out, to an electronically readable data carrier and to a magnetic resonance device for this.

BACKGROUND

Magnetic resonance tomography (MRT) is an imaging method which enables the high-resolution generation of sectional images of living organisms, such as humans. The patient is placed in a homogeneous magnetic field B0. Using gradient coils the outer magnetic field in the FOV (field of view) is modified in such a way that firstly, a body layer is selected and secondly, the generated magnetic resonance (MR) signals are spatially encoded.

During the subsequent reconstruction of the MR signals, by way of example by Fourier transformation, an image of the selected layer is produced which is used for medical diagnosis. The MR signals are generated and detected using a high-frequency system, comprising a transmitting antenna, which radiates high-frequency (HF) excitation pulses into the patient, and a receiving antenna, which detects the emitted HF resonance signals and forwards them for image reconstruction. The contrast of the MR images can be varied in many ways depending on the diagnostic task by the selection of a suitable pulse sequence, such as a spin echo sequence or a gradient echo sequence, and the sequence parameters pertaining thereto. The MRT images body structures and therefore provides a structural imaging method.

Movements during an MR scan, such as respiratory movements of a patient who is to be examined by way of MR, can lead in magnetic resonance imaging, primarily in the case of an examination of the organs of the thorax and the abdomen, in particular of examination areas affected by the respiratory movement of the patient, to artifacts, such as what is known ghosting or blurring and/or to a loss of intensity in the generated images and to registration errors between generated images. These artifacts can make a diagnosis on the basis of these images, for example by a physician, difficult and can lead to, for example, lesions being overlooked.

Numerous methods exist in the prior art for reducing artifacts as a consequence of, by way of example, a respiratory movement. One of these methods is the activation of a trigger signal to detect magnetic resonance image data as a function of a respiratory movement or, generally, what is known as breathing gating. Breathing gating is a method in which the breathing of the patient is detected during the MR measurement and is associated with the acquired measurement data. With breathing gating the measurement data is only used for reconstruction if the detected respiratory movement meets certain predefinable criteria.

The breathing of the patient can be detected in this connection using external sensors, for example a pneumatic cushion, or using MR signals, what are known as navigators. A navigator is usually a short sequence which acquires MR signals for example from the diaphragm or another signal source in the examination object, whose movement is correlated with the breathing of the patient. The respiratory movement can be traced by way of the position of the diaphragm or the other signal source.

In the case of breathing gating with navigators, the navigator sequence is interleaved by way of example with the imaging sequence and a diaphragm position measured using a navigator is then associated with the imaging data acquired immediately thereafter or therebefore.

A distinction is made between retrospective and prospective breathing gating.

With retrospective breathing, gating the respiratory movement is detected and recorded during the MR measurement, but is not evaluated. Instead, the k-space that is to be detected is measured several times. Only some of the measured data is used for reconstruction, and preferably that in which the breathing signal is in a specific window around an excellent breathing position. If a specific k-space data point that is required for image reconstruction was measured several times within the excellent window, the data can be averaged. If, on the other hand, a data point was always measured outside of the window, the data point which has the smallest deviation from the excellent position can be used for reconstruction.

With prospective breathing gating the physiological breathing signal measured with the aid of a breathing sensor (for example the diaphragm position measured using a navigator sequence) is evaluated during the measurement and the MR measurement controlled on the basis of the detected physiological signal. In the simplest embodiment, what is known as the acceptance/rejection algorithm (ARA), the measurement of an imaging data packet (and optionally the associated navigator sequence) is repeated until the physiological signal falls within a previously defined acceptance window.

A further possibility for artifact reduction resides in a movement-compensated reconstruction. In this case the image data is segmented into states of different breathing stages after detection of respiration. After a reconstruction of the images for the corresponding breathing stages a movement model is estimated by way of a registration, with the aid of which model a movement-free image volume is in turn reconstructed.

The various methods also have different signal-to-noise ratios. A priori it is not clear which method delivers the best results.

DE 10 2012 213 551 A1 relates to a method for movement-averaged attenuation correction of PET data. For this purpose MRT data is sorted by various gating methods according to its movement phase, in particular breathing phase, with all data records emerging from the sorting process continuing to be considered, however, and being averaged later.

DE 10 2012 206 555 A1 relates to a method for the acquisition of a magnetic resonance data record of a breathing examination object, with the breathing phase being estimated by a state machine for prospective gating.

The article "Thoracic respiratory motion estimation from MRI using a statistical model and a 2-D image navigator" by A. P. King et al., Medical Image Analysis 16 (2012), 252-264, relates to the magnetic resonance-based movement correction of PET data.

SUMMARY

At least one embodiment of the present invention discloses a method which allows a type of reconstruction of image data from a magnetic resonance measurement to be determined with an improved signal-to-noise ratio.

At least one embodiment is directed to a method. At least one embodiment is directed to a magnetic resonance device, a computer program, and a computer-readable storage medium. Advantageous embodiments of the invention are disclosed in the subclaims respectively referred to.

A method for the reconstruction of image data from a magnetic resonance measurement of an examination object by way of a magnetic resonance device is provided, the method comprising:

determining at least one first parameter which comprises information about a breathing process of the examination object;

comparing the at least one first parameter with at least one second parameter from a maintained database; and determining a type of reconstruction of image data of the magnetic resonance measurement according to the comparison that has been made.

Further, at least one embodiment of the invention relates to a method for determining a type of reconstruction of image data from a magnetic resonance measurement of an examination object via a magnetic resonance device from a group of at least two reconstruction methods, comprising:

determining at least one first parameter which comprises information about a breathing process of the examination object;

ascertaining at least one comparison value that describes an improvement in image quality between two of the at least two image reconstruction methods using a correlation that evaluates the at least one first parameter and described by regression coefficients, wherein the regression values are ascertained by a regression in training data which contains at least one second parameter, each corresponding to the at least one first parameter, each with associated comparison values; and electing a reconstruction method for the image data from the magnetic resonance measurement as a function of the ascertained at least one comparison value.

Within the context of at least one embodiment of the present invention, a magnetic resonance device for determining a type of a reconstruction of image data from a magnetic resonance measurement of an examination object is also provided.

The magnetic resonance device comprises a reconstruction unit and a processing unit and is designed to carry out the following:

determining at least one first parameter which comprises information about a breathing process of the examination object by means of the processing unit comparing the at least one first parameter with at least one second parameter from a maintained database by means of the processing unit and determining a type of reconstruction of image data of the magnetic resonance measurement according to the comparison that has been made by means of the processing unit.

At least one embodiment of the present invention also is directed to a computer program which can be loaded into a memory unit of a programmable controller or an arithmetic unit of a magnetic resonance device. All embodiments of the inventive method or different embodiments that have been described above can be executed with this computer program if the computer program runs in the controller or control device of the magnetic resonance device. The computer program potentially requires program resources, for example libraries and help functions, to implement the corresponding embodiments of the method. In other words, the claim directed toward the computer program is intended to protect software with which one of the embodiments of the inventive method described above can be executed or which implements this embodiment. The software can be a source code which still has to be compiled and linked or which only has to be interpreted, or an executable software code which only has to be loaded into the appropriate arithmetic for execution.

At least one embodiment of the present invention also relates to an electronically readable storage medium, for example a DVD, magnetic tape or USB stick, on which electronically readable control information, in particular software is stored. If this control information is read from the storage medium and stored in a controller or arithmetic unit of a magnetic resonance device, then all inventive embodiments of the method described above can be implemented.

The advantages of embodiments of the inventive magnetic resonance device, embodiments of the inventive computer program and embodiments of the inventive electronically readable storage medium substantially match the advantages of embodiments of the inventive method which have been stated above in detail. Features, advantages or alternative embodiments mentioned in this connection are likewise to be transferred to the other claimed subject matters and vice versa. In other words, the claims in question, which are directed by way of example toward a magnetic resonance device, may also be developed by the features which are described or claimed in connection with a method. The corresponding functional features of the method are formed by appropriate representational modules, in particular by hardware modules.

BRIEF DESCRIPTION OF THE DRAWINGS

The invention will be described and explained in more detail below with reference to the example embodiments illustrated in the figures, in which.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

A method for the reconstruction of image data from a magnetic resonance measurement of an examination object by way of a magnetic resonance device is provided, the method comprising:

determining at least one first parameter which comprises information about a breathing process of the examination object;

comparing the at least one first parameter with at least one second parameter from a maintained database; and determining a type of reconstruction of image data of the magnetic resonance measurement according to the comparison that has been made.

A first parameter, which comprises information about a breathing process of the examination object, is in this case taken to mean by way of example a statistical value and/or a feature which receives information about an underlying breathing process of the examination object.

A second parameter from a maintained database likewise comprises by way of example a statistical value and/or a feature with which the first parameter can be compared.

A comparison of these two parameters means it is then possible to make a prediction about a type of reconstruction of image data from the magnetic resonance measurement which delivers an optimum signal-to-noise ratio and therefore an optimized image quality.

The comparison can be made implicitly or explicitly. An implicit comparison is given by way of example if regression coefficients of a correlation, which describes a comparison value that describes the improvement in image quality of a first reconstruction method compared to a second reconstruction method as a function of the first parameter, are determined from training data, wherein the training data describes second parameters and the improvements in image quality associated with them. During the course of a regression the regression coefficients, which may also be understood as second parameters, can be determined and stored in the database.

By way of example, the comparison value that describes the improvement in image quality can be a variable that indicates the improvement in the signal-to-noise ratio when the first reconstruction method is used, in comparison to the second reconstruction method, in particular the ratio of the respective signal-to-noise ratio in the magnetic resonance images reconstructed using the respective reconstruction methods.

Alternatively it is of course also conceivable for the comparison to be made explicitly. The database then does not contain regression coefficients but second parameters corresponding in the manner of a Look-Up Table to the first parameter, together with respectively associated comparison values that describe the improvement in image quality. The comparison value whose second parameter most closely matches the first parameter can be chosen. It is also possible, however, to perform an interpolation.

The choice of a type of reconstruction (reconstruction method) is then made as a function of the comparison value, wherein a threshold value by way of example can be estimated, above which it seems worthwhile to use a slower reconstruction method or the like.

In an advantageous embodiment, the at least one first parameter and/or the at least one second parameter is/are derived from a histogram of respiratory phases. Targeted feature extraction of this kind means that a distinction can easily be made between different types of breathing, so a conclusion about a preferred type of reconstruction of image data is possible.

Histogram variables of this kind have proven to be particularly expedient since, in particular when making regression observations, high correlation factors have resulted between a parameter of this kind that describes the breathing and the comparison value. In the case of a scattered histogram, which shows a broad distribution, only a small portion of the magnetic resonance data (image data) is actually taken into account in the case of a reconstruction weighted according to respiratory phases, as a (first) reconstruction method, since the reconstruction is based only on a specific breathing phase. For a movement-compensated (second) reconstruction method all image data can be fully utilized, however, so here the improved image quality, in particular the improved signal-to-noise ratio, can be expected. The histogram variable can advantageously describe which portion of the image data is in a window in which image data is taken into account in the first reconstruction method with positive weighting. Surprisingly, a very good correlation has resulted with a comparison value that describes the ratio of the signal-to-noise ratios if a regression is performed, in particular, if the first regression method relates to a weighted type of reconstruction that emerges from retrospective gating and the second reconstruction method relates to a movement-compensated type of reconstruction.

In a further embodiment, the at least one second parameter comprises at least one regression coefficient. The effect of a plurality of system variables can consequently be taken into account and it is also possible to distinguish between different types of breathing and to draw a conclusion about a preferred type of reconstruction of image data. As already mentioned, regression coefficients that are based on the evaluation of further second parameters that form part of the training data and correspond to the first parameter may also be understood as second parameters since they are ultimately used for the comparison process.

In a preferred embodiment, the type of reconstruction of image data from the magnetic resonance measurement comprises breathing gating. Since this type of image reconstruction uses just some of the recorded image data with positive weighting, it is superior to other methods in terms of speed.

In an advantageous embodiment, the type of reconstruction of image data from the magnetic resonance measurement comprises a movement-compensated reconstruction. Since this type of image reconstruction (reconstruction method) usually uses all recorded image data it is superior to other methods in terms of accuracy.

In a further embodiment, the maintained database comprises a self-learning system. The accuracy of the determination of the type of reconstruction of image data from the magnetic resonance measurement can consequently be increased according to the comparison that has been made, the accuracy increasing with the number of available learning data records (training data).

Within the context of at least one embodiment of the present invention, a magnetic resonance device for determining a type of a reconstruction of image data from a magnetic resonance measurement of an examination object is also provided.

At least one embodiment of the invention relates to a magnetic resonance device for the reconstruction of image data from a magnetic resonance measurement of an examination object, the magnetic resonance device comprising:
  a reconstruction unit; and
  a processing unit, the processing unit being designed to:
    determine at least one first parameter which comprises information about a breathing process of the examination object,
    compare the at least one first parameter with at least one second parameter from a maintained database, and
    determine the type of reconstruction of image data from the magnetic resonance measurement, to be performed by the reconstruction unit, according to the comparison.

In at least one embodiment, the magnetic resonance device comprises a reconstruction unit and a processing unit and is designed to carry out the following:
  determining at least one first parameter which comprises information about a breathing process of the examination object by means of the processing unit
  comparing the at least one first parameter with at least one second parameter from a maintained database by means of the processing unit and
  determining a type of reconstruction of image data of the magnetic resonance measurement according to the comparison that has been made by means of the processing unit.

The actual image reconstruction occurs by means of the reconstruction unit.

At least one embodiment of the present invention also is directed to a computer program which can be loaded into a memory unit of a programmable controller or an arithmetic unit of a magnetic resonance device. All embodiments of the inventive method or different embodiments that have been described above can be executed with this computer program if the computer program runs in the controller or control device of the magnetic resonance device. The computer program potentially requires program resources, for example libraries and help functions, to implement the corresponding embodiments of the method. In other words, the claim directed toward the computer program is intended to protect software with which one of the embodiments of the inventive method described above can be executed or which implements this embodiment. The software can be a source code which still has to be compiled and linked or which only has to be interpreted, or an executable software code which only has to be loaded into the appropriate arithmetic for execution.

Further, at least one embodiment of the invention relates to a memory unit of a programmable controller of a magnetic resonance device, including a computer program including program segments configured to execute at least one embodiment of the method upon the computer program being run in the controller of the magnetic resonance device.

At least one embodiment of the present invention also relates to an electronically readable storage medium, for example a DVD, magnetic tape or USB stick, on which electronically readable control information, in particular software is stored. If this control information is read from the storage medium and stored in a controller or arithmetic unit of a magnetic resonance device, then all inventive embodiments of the method described above can be implemented.

The advantages of embodiments of the inventive magnetic resonance device, embodiments of the inventive computer program and embodiments of the inventive electronically readable storage medium substantially match the advantages of embodiments of the inventive method which have been stated above in detail. Features, advantages or alternative embodiments mentioned in this connection are likewise to be transferred to the other claimed subject matters and vice versa. In other words, the claims in question, which are directed by way of example toward a magnetic resonance device, may also be developed by the features which are described or claimed in connection with a method. The corresponding functional features of the method are formed by appropriate representational modules, in particular by hardware modules.

Figure 1:
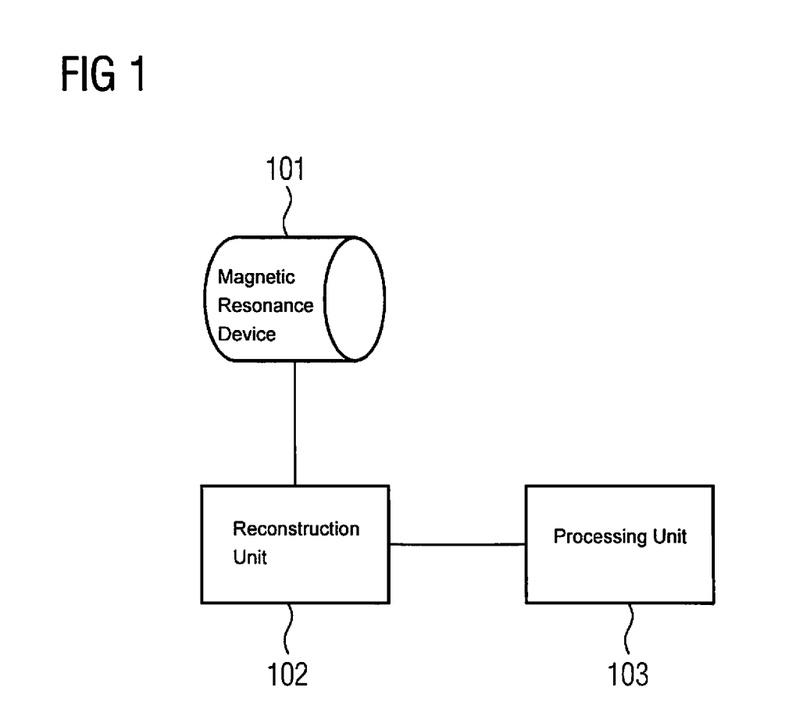
FIG. 1 shows an inventive magnetic resonance device.

FIG. 1 shows an inventive magnetic resonance device 101. The magnetic resonance device 101 comprises a reconstruction unit 102 and a processing unit 103 and is designed to carry out a determination of a type of reconstruction of image data from a magnetic resonance measurement.

The magnetic resonance device 101 is designed here as a pure magnetic resonance device 101. Alternatively, the magnetic resonance device 101 can also comprise a combined magnetic resonance positron emission tomography device.

Figure 2:
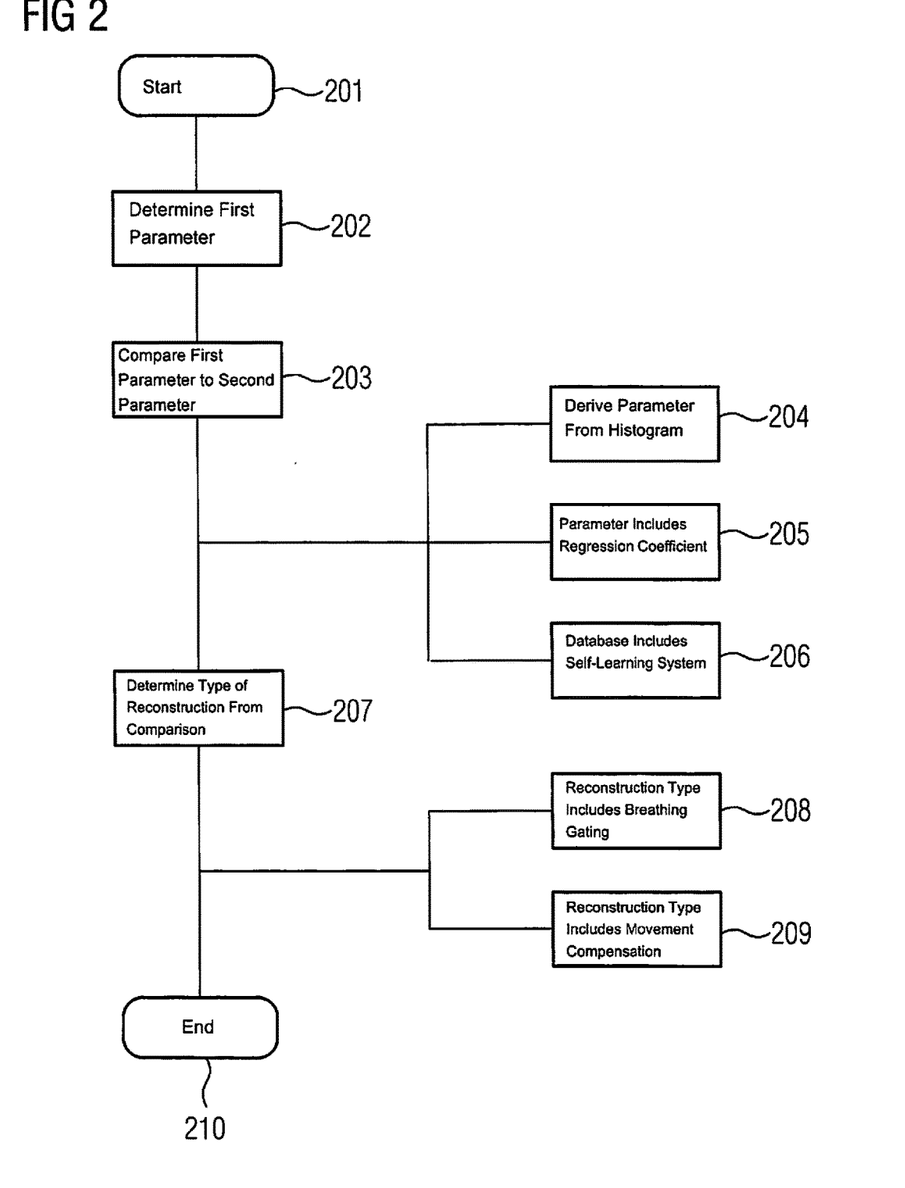
FIG. 2 shows a flow diagram of an inventive method.

FIG. 2 shows a flow diagram of an inventive method. The method comprises the method steps 201 to 210, wherein the description of the method steps 201 to 210 also uses parts of the description, including the corresponding reference numerals introduced in connection with FIG. 1.

A first method step 201 characterizes the start of a method for determining a type of reconstruction of image data from a magnetic resonance measurement of an examination object by means of (i.e. by way of) a magnetic resonance device 101.

In method step 202 at least one first parameter is determined which comprises information about a breathing process of the examination object by means of the processing unit 103. A first parameter, which comprises information about a breathing process of the examination object, is taken to mean by way of example a statistical value and/or a feature which obtains information about an underlying breathing process of the examination object.

Method step 203 comprises a comparison of the at least one first parameter with at least one second parameter from a maintained database by means of the processing unit 103. The second parameter from a maintained database likewise comprises by way of example a statistical value and/or a feature with which the first parameter can be compared. A comparison of these two parameters makes it possible to make a prediction about a type of reconstruction of image data from the magnetic resonance measurement which delivers an optimized signal-to-noise ratio and therefore an optimized image quality.

During an optional method step 204 the at least one first parameter and/or the at least one second parameter are derived from a histogram of respiratory phases by means of the processing unit 103.

In a method step 205, an optional method step, the at least one first parameter and/or the at least one second parameter comprises at least one regression coefficient.

When executing the inventive method the method steps 203 and 204 can be used alternatively or combined with each other.

In method step 206 the maintained database comprises a self-learning system.

Determination of a type of reconstruction of image data from the magnetic resonance measurement occurs during a method step 207 according to the comparison that has been made by means of the processing unit 103.

In method step 208, an optional method step, the type of reconstruction of image data from the magnetic resonance measurement comprises breathing gating.

In method step 209, also an optional method step, the type of reconstruction of image data from the magnetic resonance measurement comprises a movement-compensated reconstruction.

A final method step 210 characterizes the end of the method for determining a type of reconstruction of image data from a magnetic resonance measurement of an examination object by means of a magnetic resonance device 101.

Although the invention has been illustrated and described in detail by the preferred example embodiments, it is not limited by the disclosed examples and a person skilled in the art can derive other variations herefrom without departing from the scope of the invention.

To summarize, at least one embodiment of the invention relates to a method for determining a type of reconstruction of image data from a magnetic resonance measurement of an examination object by way of a magnetic resonance device, the method comprising:

determining at least one first parameter which comprises information about a breathing process of the examination object comparing the at least one first parameter with at least one second parameter from a maintained database and determining a type of reconstruction of image data from the magnetic resonance measurement according to the comparison that has been made.

In a preferred embodiment the at least one first parameter and/or the at least one second parameter are derived from a histogram of respiratory phases and the maintained database comprises a self-learning system.

Further, at least one embodiment of the invention relates to a method for determining a type of reconstruction of image data from a magnetic resonance measurement of an examination object via a magnetic resonance device from a group of at least two reconstruction methods, comprising:

determining at least one first parameter which comprises information about a breathing process of the examination object;

ascertaining at least one comparison value that describes an improvement in image quality between two of the at least two image reconstruction methods using a correlation that evaluates the at least one first parameter and described by regression coefficients, wherein the regression values are ascertained by a regression in training data which contains at least one second parameter, each corresponding to the at least one first parameter, each with associated comparison values; and electing a reconstruction method for the image data from the magnetic resonance measurement as a function of the ascertained at least one comparison value.

Further, at least one embodiment of the invention relates to a magnetic resonance device for the reconstruction of image data from a magnetic resonance measurement of an examination object, the magnetic resonance device comprising:

a reconstruction unit; and
a processing unit, the processing unit being designed to:
determine at least one first parameter which comprises information about a breathing process of the examination object,
compare the at least one first parameter with at least one second parameter from a maintained database, and
determine the type of reconstruction of image data from the magnetic resonance measurement, to be performed by the reconstruction unit, according to the comparison.

Further, at least one embodiment of the invention relates to a memory unit of a programmable controller of a magnetic resonance device, including a computer program including program segments configured to execute at least one embodiment of the method upon the computer program being run in the controller of the magnetic resonance device.

A memory unit of a programmable controller of a magnetic resonance device, including a computer program including program segments configured to execute at least one embodiment of the method upon the computer program being run in the controller of the magnetic resonance device.

Further, at least one embodiment of the invention relates to a non-transitory computer-readable storage medium comprising electronically readable control information stored thereon, configured in such that when the storage medium is used in a controller of a magnetic resonance device, at least one embodiment of the method is carried out.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for determining a type of reconstruction of image data from a magnetic resonance measurement of an examination object via a magnetic resonance device, the method comprising:
    determining at least one first parameter which comprises information about a breathing process of the examination object;
    comparing the at least one first parameter with at least one second parameter from a maintained database; and
    determining the type of reconstruction of image data from the magnetic resonance measurement according to the comparison.

2. The method of claim 1, wherein at least one of the at least one first parameter and the at least one second parameter is derived from a histogram of respiratory phases.

3. The method of claim 2, wherein at least one of the at least one first parameter and the at least one second parameter includes at least one regression coefficient.

4. The method of claim 2, wherein the type of reconstruction of image data from the magnetic resonance measurement comprises a breathing gating.

5. The method of claim 2, wherein the type of reconstruction of image data from the magnetic resonance measurement comprises a movement-compensated reconstruction.

6. The method of claim 1, wherein at least one of the at least one first parameter and the at least one second parameter includes at least one regression coefficient.

7. The method of claim 6, wherein the type of reconstruction of image data from the magnetic resonance measurement comprises a breathing gating.

8. The method of claim 6, wherein the type of reconstruction of image data from the magnetic resonance measurement comprises a movement-compensated reconstruction.

9. The method of claim 1, wherein the type of reconstruction of image data from the magnetic resonance measurement comprises a breathing gating.

10. The method of claim 1, wherein the type of reconstruction of image data from the magnetic resonance measurement comprises a movement-compensated reconstruction.

11. The method of claim 1, wherein the maintained database comprises a self-learning system.

12. A memory unit of a programmable controller of a magnetic resonance device, including a computer program including program segments configured to execute the method of claim 1 upon the computer program being run in the controller of the magnetic resonance device.

13. A non-transitory computer-readable storage medium comprising electronically readable control information stored thereon, configured in such that when the storage medium is used in a controller of a magnetic resonance device, the method of claim 1 is carried out.

14. A magnetic resonance device for the reconstruction of image data from a magnetic resonance measurement of an examination object, the magnetic resonance device comprising:
    a reconstruction unit; and
    a processing unit, the processing unit being designed to:
        determine at least one first parameter which comprises information about a breathing process of the examination object,
        compare the at least one first parameter with at least one second parameter from a maintained database, and
        determine the type of reconstruction of image data from the magnetic resonance measurement, to be performed by the reconstruction unit, according to the comparison.

15. A method for determining a type of reconstruction of image data from a magnetic resonance measurement of an examination object via a magnetic resonance device from a group of at least two reconstruction methods, comprising:
    determining at least one first parameter which comprises information about a breathing process of the examination object;
    ascertaining at least one comparison value that describes an improvement in image quality between two of the at least two image reconstruction methods using a correlation that evaluates the at least one first parameter and described by regression coefficients, wherein the regression values are ascertained by a regression in training data which contains at least one second parameter, each corresponding to the at least one first parameter, each with associated comparison values; and
    electing a reconstruction method for the image data from the magnetic resonance measurement as a function of the ascertained at least one comparison value.

16. The method of claim 15, wherein at least one of the at least one first parameter and the at least one second parameter are derived from a histogram of respiratory phases.

17. The method of claim 16, wherein the reconstruction method comprises a weighted reconstruction according to retrospective breathing gating and a movement-compensated reconstruction.

18. The method of claim 15, wherein the reconstruction method comprises a weighted reconstruction according to retrospective breathing gating and a movement-compensated reconstruction.

19. A memory unit of a programmable controller of a magnetic resonance device, including a computer program including program segments configured to execute the method of claim 15 upon the computer program being run in the controller of the magnetic resonance device.

20. A non-transitory computer-readable storage medium comprising electronically readable control information stored thereon, configured in such that when the storage medium is used in a controller of a magnetic resonance device, the method of claim 15 is carried out.

* * * * *